(12) United States Patent
Mou et al.

(10) Patent No.: US 12,440,708 B2
(45) Date of Patent: *Oct. 14, 2025

(54) NASAL-PLUG FILTER DEVICE

(71) Applicant: MICROJET TECHNOLOGY CO., LTD., Hsinchu (TW)

(72) Inventors: Hao-Jan Mou, Hsinchu (TW);
Hsien-Chung Tai, Hsinchu (TW);
Chi-Feng Huang, Hsinchu (TW);
Yung-Lung Han, Hsinchu (TW);
Chang-Yen Tsai, Hsinchu (TW);
Wei-Ming Lee, Hsinchu (TW); Yang Ku, Hsinchu (TW)

(73) Assignee: MICROJET TECHNOLOGY CO., LTD., Hsinchu (TW)

( * ) Notice: Subject to any disclaimer, the term of this patent is extended or adjusted under 35 U.S.C. 154(b) by 1150 days.

This patent is subject to a terminal disclaimer.

(21) Appl. No.: 17/354,035

(22) Filed: Jun. 22, 2021

(65) Prior Publication Data
US 2022/0008766 A1     Jan. 13, 2022

(30) Foreign Application Priority Data
Jul. 10, 2020   (TW) ................. 109123480

(51) Int. Cl.
*A62B 23/06*    (2006.01)
*A01N 59/00*    (2006.01)
(Continued)

(52) U.S. Cl.
CPC .............. *A62B 23/06* (2013.01); *A01N 59/00* (2013.01); *A01N 65/00* (2013.01); *A01N 65/08* (2013.01);
(Continued)

(58) Field of Classification Search
CPC . A62B 23/06; A62B 18/006; A61L 2209/111; A61M 16/0666; A61M 16/0672
See application file for complete search history.

(56) References Cited

U.S. PATENT DOCUMENTS 5,425,359 A    6/1995  Liou
5,747,705 A    5/1998  Herb et al.
(Continued)

FOREIGN PATENT DOCUMENTS

CN    204073591 U    1/2015
CN    105463837 A    4/2016
(Continued)

OTHER PUBLICATIONS

English translation of TWM574230U (Year: 2019).*

*Primary Examiner* — Brandy S Lee
*Assistant Examiner* — Mishal Zahra Hussain
(74) *Attorney, Agent, or Firm* — Birch, Stewart, Kolasch & Birch, LLP

(57) ABSTRACT

A nasal-plug filter device including a device body, a filter, a first actuator, a second actuator, and a gas sensor is provided. The device body has a ventilating channel, and the ventilating channel has an inlet end and an outlet end. The filter is disposed at the outlet end. The first actuator is disposed at the inlet end for being driven to transmit gas outside the device body into the device body. The second actuator is stacked on and bonded to the first actuator, and the second actuator is driven to transmit the gas transmitted by the first actuator to the filter to be filtered and purified. The gas sensor is disposed at the outlet end for detecting a gas quality of the gas at the outlet end. A connection element may be provided for connecting two nasal-plug filter devices with each other.

17 Claims, 14 Drawing Sheets

(51) Int. Cl.
  *A01N 65/00*     (2009.01)
  *A01N 65/08*     (2009.01)
  *A62B 9/00*      (2006.01)
  *H10N 30/20*     (2023.01)
  *H10N 30/80*     (2023.01)

(52) U.S. Cl.
  CPC ......... *A62B 9/006* (2013.01); *H10N 30/2047* (2023.02); *H10N 30/802* (2023.02)

(56) References Cited

U.S. PATENT DOCUMENTS

| | | | |
|---|---|---|---|
| 9,611,843 B2 * | 4/2017 | Hsueh | F04B 43/046 |
| 11,187,225 B2 * | 11/2021 | Mou | G01N 33/0009 |
| 2009/0060750 A1 * | 3/2009 | Chen | F04B 43/043 |
| | | | 417/26 |
| 2020/0166155 A1 | 5/2020 | Mou et al. | |

FOREIGN PATENT DOCUMENTS

| | | | |
|---|---|---|---|
| CN | 109381813 A | | 2/2019 |
| CN | 110412210 A | | 11/2019 |
| CN | 110579565 A | | 12/2019 |
| CN | 111151311 A | | 5/2020 |
| TW | M560920 U | | 6/2018 |
| TW | M574230 U | * | 2/2019 |
| TW | M576492 U | | 4/2019 |
| TW | 202001217 A | | 1/2020 |
| TW | I681117 B | | 1/2020 |
| TW | I736309 B | | 8/2021 |

* cited by examiner

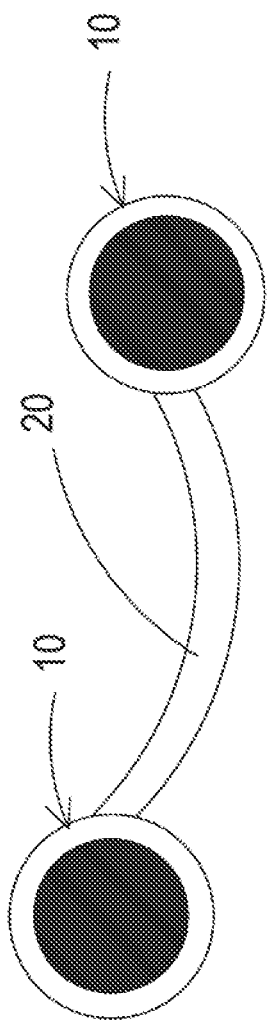

NASAL-PLUG FILTER DEVICE

CROSS-REFERENCE TO RELATED APPLICATION

This non-provisional application claims priority under 35 U.S.C. § 119(a) to Patent Application No. 109123480 filed in Taiwan, R.O.C. on Jul. 10, 2020, the entire contents of which are hereby incorporated by reference.

BACKGROUND

Technical Field

The present disclosure relates to a filter device, in particular, to a nasal-plug filter device that is capable of being inserted into a nostril of a user to enhance the gas introduction procedure, and the nasal-plug filter device is further combined with a gas detection function.

Related Art

Nowadays people pay more and more attention to monitoring ambient air quality in daily life, such as carbon monoxide, carbon dioxide, volatile organic compounds (VOC), PM2.5, nitric oxide, and sulfur monoxide etc., and the particle suspended in the air, which can cause adverse health effects on the human body when exposure to these gases, and can even be life-threatening. Therefore, various countries has focused on the topic of how to monitor ambient air quality to avoid or escape from the health affecting effects and/or injuries in time.

Moreover, in order to avoid breathing harmful gases or particles into the human body, a kind of nasal-plug filter that can be inserted into a nostril to provide filtration and purification function for inhaled gases is provided now. However, the filter inside the nasal-plug filter might make the user suffer from the problem of insufficient inhaled volume and breathing difficulty, resulting in the discomfort condition of the user during using such nasal-plug filter.

In view of above disadvantages, how to provide a nasal-plug filter device that could solve above problems is an issue to be addressed.

SUMMARY

One object of the present disclosure is to provide a nasal-plug filter device inserted into a nostril of a user. Through the operation of the first actuator or the second actuator inside the nasal-plug filter device, the introduction flow of the gas can be increased, so that the gas with higher pressure or higher volume can be directed to the filter, and thus the gas introduction effect can be improved. The gas can pass through the filter more quickly, so that a filtered and purified gas can be provided. Moreover, the gas sensor in the nasal-plug filter device can also detect the introduced gas, so that the user not only can breathe the filtered and purified gas but also can understand the quality of the gas to be inhaled.

Another object of the present disclosure is to provide a nasal-plug filter device inserted into a nostril of a user. With the combination of the first actuator and the second actuator in the nasal-plug filter device, the first actuator can provide the gas introduced into the nasal-plug filter device with high pressure, and the second actuator can provide a relatively larger volume of gas to the filter, whereby the gas introduction effect can be improved and the gas can pass through the filter more quickly and become a filtered and purified gas to be inhaled by human. Moreover, the gas sensor in the nasal-plug filter device can also detect the introduced gas, so that the user not only can breathe the filtered and purified gas, but also can understand the quality of the gas to be inhaled. In some embodiments, two nasal-plug filter devices are connected by a connection element, and the two nasal-plug filter devices can be inserted into two nostrils of a user respectively, so as to provide the user with filtered and purified gas.

In one general embodiment of the present disclosure, a nasal-plug filter device including a device body, a filter, a first actuator, a second actuator, and a gas sensor is provided. The device body has a ventilating channel, and the ventilating channel has an inlet end and an outlet end. The filter is disposed in the ventilating channel. The first actuator fabricated by semiconductor manufacturing processes is disposed at the inlet end of the ventilating channel, and is driven to transmit gas outside the device body into the device body with a relatively higher pressure. The second actuator fabricated by semiconductor manufacturing processes is stacked on and bonded to the first actuator, and is driven to retransmit the gas transmitted by the first actuator to the filter to be filtered and purified. The gas sensor is disposed at the outlet end of the ventilating channel for detecting a gas quality of the gas at the outlet end.

In another general embodiment of the present disclosure, a nasal-plug filter device including a device body, a filter, a first actuator, and a gas sensor is provided. The device body has a ventilating channel, and the ventilating channel has an inlet end and an outlet end. The filter is disposed in the ventilating channel. The first actuator fabricated by semiconductor manufacturing processes is disposed at the ventilating channel, and is driven to transmit gas outside the device body into the device body with a relatively higher pressure and to the filter to be filtered and purified. The gas is then discharged out from the outlet end. The gas sensor is disposed at the outlet end of the ventilating channel for detecting a gas quality of the gas at the outlet end.

In yet another general embodiment of the present disclosure, a nasal-plug filter device including a device body, a filter, a second actuator, and a gas sensor is provided. The device body has a ventilating channel, and the ventilating channel has an inlet end and an outlet end. The filter is disposed in the ventilating channel. The second actuator fabricated by semiconductor manufacturing processes is disposed at the ventilating channel, and is driven to transmit gas outside the device body into the device body with a relatively higher pressure and to the filter to be filtered and purified. The gas is then discharged out from the outlet end. The gas sensor is disposed at the outlet end of the ventilating channel for detecting a gas quality of the gas at the outlet end.

BRIEF DESCRIPTION OF THE DRAWINGS

The disclosure will become more fully understood from the detailed description given herein below, for illustration only and thus not limitative of the disclosure, wherein:

FIG. 1 illustrates a schematic view of a nasal-plug filter device according to an exemplary embodiment of the present disclosure;

DETAILED DESCRIPTION

The present disclosure will now be described more specifically with reference to the following embodiments. It is to be noted that the following descriptions of different embodiments of this disclosure are presented herein for purpose of illustration and description only, and it is not intended to limit the scope of the present disclosure.

Figure 2A:
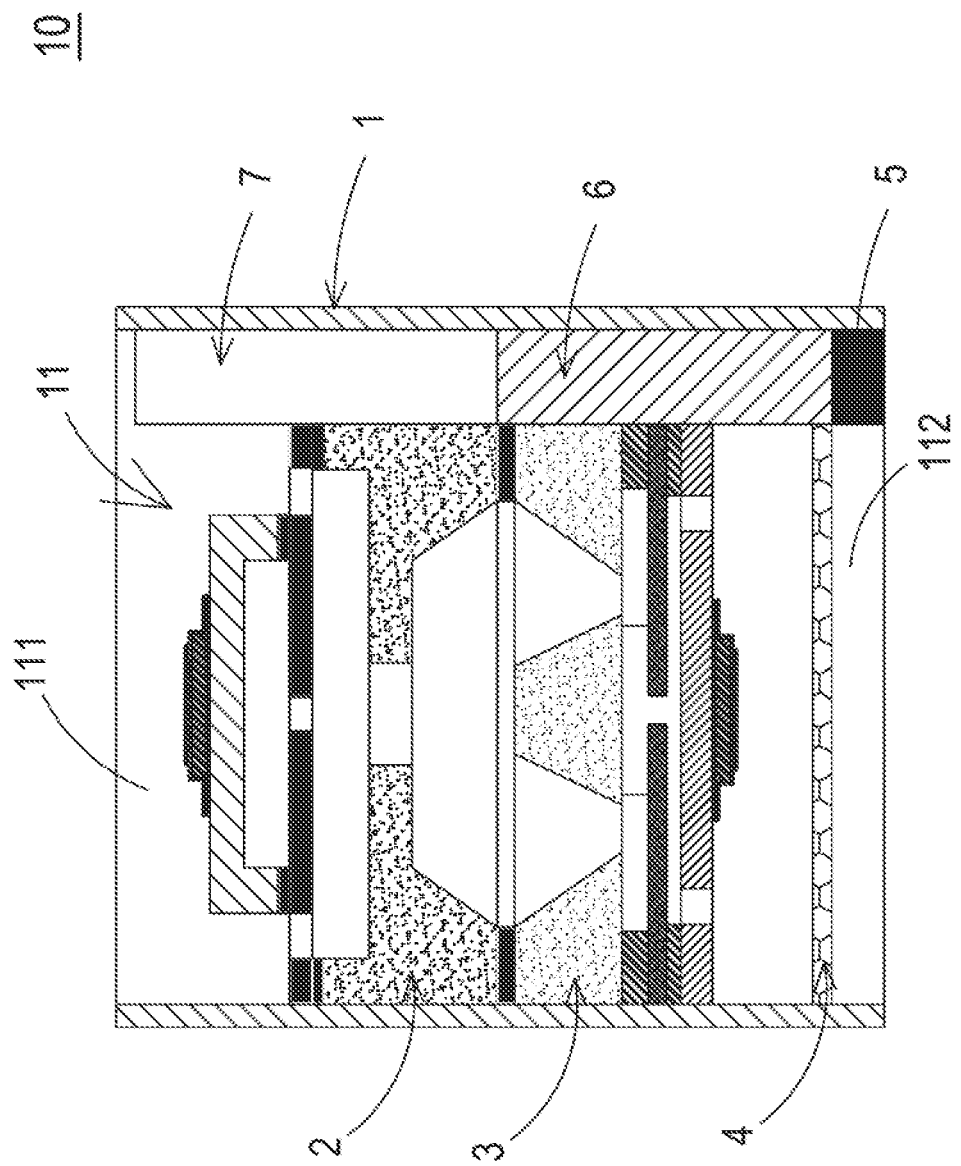
FIG. 2A illustrates a schematic cross-sectional view of the nasal-plug filter device having a first actuator and a second actuator stacked on and bonded to each other to perform gas introduction, filtration, and purification according to the exemplary embodiment of the present disclosure.
Figure 2B:
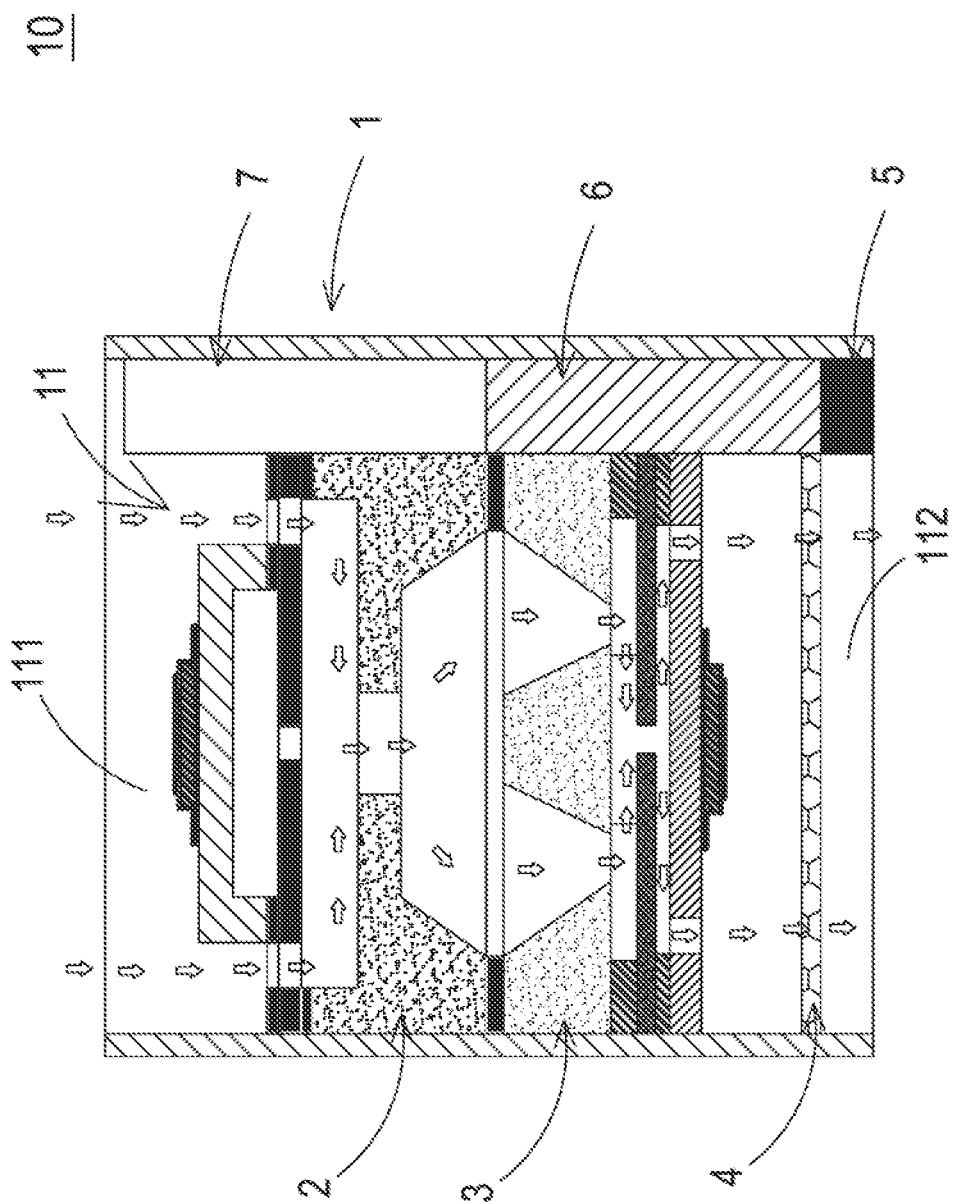
FIG. 2B illustrates a schematic cross-sectional view showing the gas flow direction in the nasal-plug filter device having the first actuator and the second actuator stacked on and bonded to each other to perform gas introduction, filtration, and purification according to the exemplary embodiment of the present disclosure.

As shown in FIG. 1, FIG. 2A and FIG. 2B, an embodiment of the present disclosure provides a nasal-plug filter device 10, including a device body 1, a first actuator 2, a second actuator 3, a filter 4, a gas sensor 5, a driving chip 6, and a battery 7. The device body 1 has a ventilating channel 11. The ventilating channel 11 has an inlet end 111 and an outlet end 112. The filter 4 is disposed at the outlet end 112 of the ventilating channel 11 for filtering the gas passing therethrough. The filtered gas is discharged out of the device body 1 from the outlet end 112. The first actuator 2, the second actuator 3, the driving chip 6, and the battery 7 are disposed at the inlet end 111 of the ventilating channel 11. The battery 7 provides operation power for the driving chip 6, so that the driving chip 6 can drive the first actuator 2 and the second actuator 3. The first actuator 2 fabricated by semiconductor manufacturing processes is driven to transmit the gas outside the device body 1 into the device body 1 with a relatively higher pressure. The second actuator 3 fabricated by semiconductor manufacturing processes is stacked on and bonded to the first actuator 2. The second actuator 3 is driven to further retransmit the gas transmitted by the first actuator 2 to the filter 4 to be filtered and purified. The gas sensor 5 is disposed at the outlet end 112 of the ventilating channel 11 for detecting the quality of the gas at the outlet end 112. The nasal-plug filter device 10 having above structure can be inserted into a nostril of a human. In this embodiment, the first actuator 2 and the second actuator 3 may be combined with each other, but not limited thereto, so as to enhance the gas introduction, and therefore, the gas can pass through the filter 4 more quickly, so that a filtered and purified gas is provided for being inhaled by human. Moreover, the gas sensor 5 in the nasal-plug filter device 10 can also detect the introduced gas, so that the user not only can breathe the filtered and purified gas, but also can understand the quality of the gas to be inhaled. The aforementioned filter 4 may be a high-efficiency particulate air (HEPA) filter for obtaining better filtration effect. Moreover, a purifying factor layer having chlorine dioxide (e.g., AMS) may be coated on the filter 4 for suppressing viruses and bacteria in the gas. Accordingly, the suppression rate for influenza A virus, influenza B virus, Enterovirus, and Norovirus may exceed 99%, thereby allowing the reduction of the cross infections of the viruses. In some other embodiments, a herbal protection coating layer including the extracts of *Rhus chinensis* Mill (may be *Rhus chinensis* Mill from Japan) and the extracts of *Ginkgo biloba* may be coated on the filter 4 to form a herbal protection anti-allergy filter which can efficiently perform anti-allergy function and destroy cell surface proteins of influenza viruses (e.g., influenza virus subtype H1N1) passing through the herbal protection anti-allergy filter. In some embodiments, the gas sensor 5 may be a particulate sensor. The particulate sensor may be a PM2.5 sensor, which is capable of detecting particulate matters in PM1, PM2, or PM10.

In some embodiments, as shown in FIG. 1, two nasal-plug filter devices 10 of the present disclosure may be connected together by a connection element 20 to form a nasal-plug filter device set. The two nasal-plug filter devices 10 can be inserted into the two nostrils of a user respectively, so as to provide filtered and purified gas for the user.

Figure 2C:
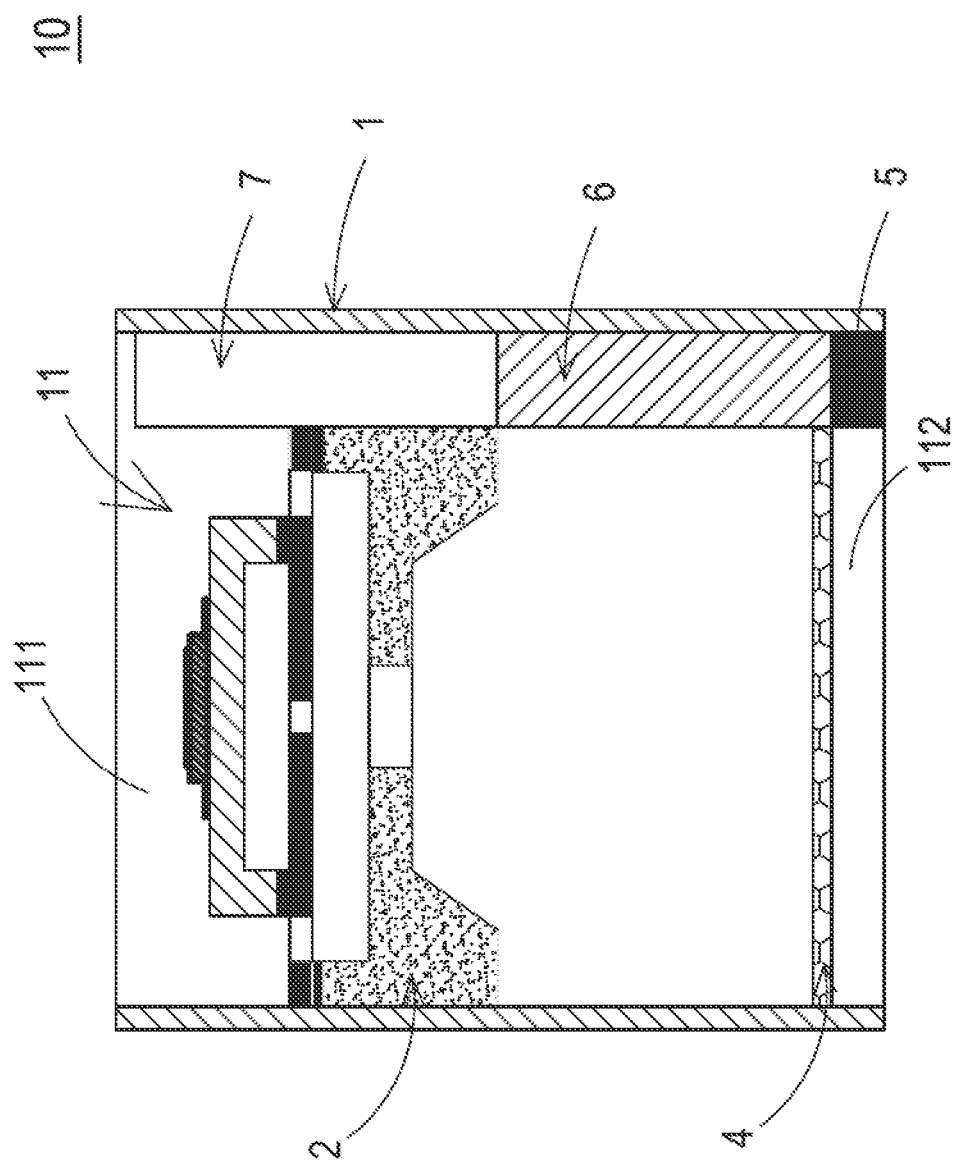
FIG. 2C illustrates a schematic cross-sectional view of a nasal-plug filter device having a first actuator to perform gas introduction, filtration, and purification according to an exemplary embodiment of the present disclosure.
Figure 2D:
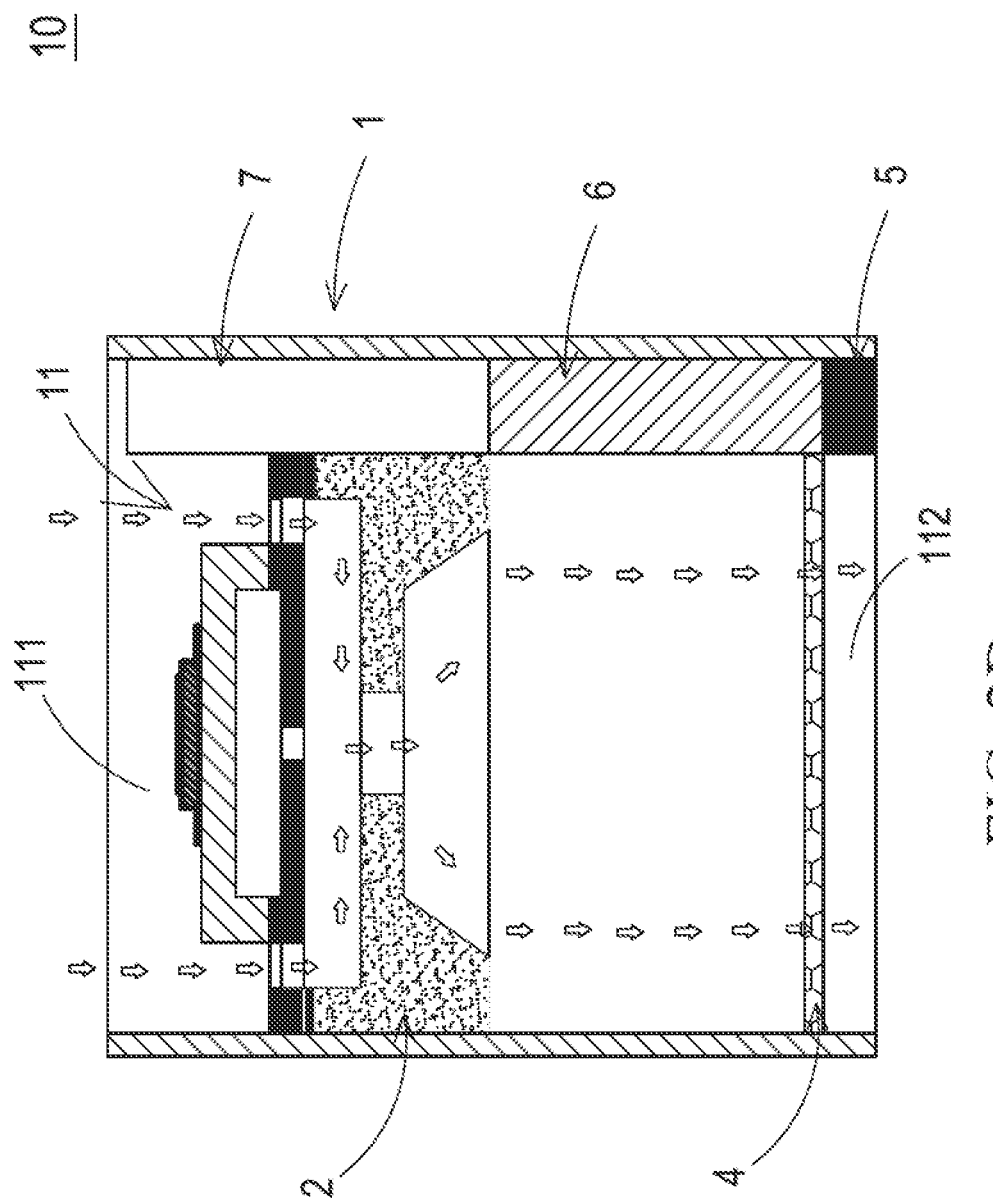
FIG. 2D illustrates a schematic cross-sectional view showing the gas flow direction in the nasal-plug filter device having the first actuator to perform gas introduction, filtration, and purification according to the exemplary embodiment of the present disclosure.
Figure 2E:
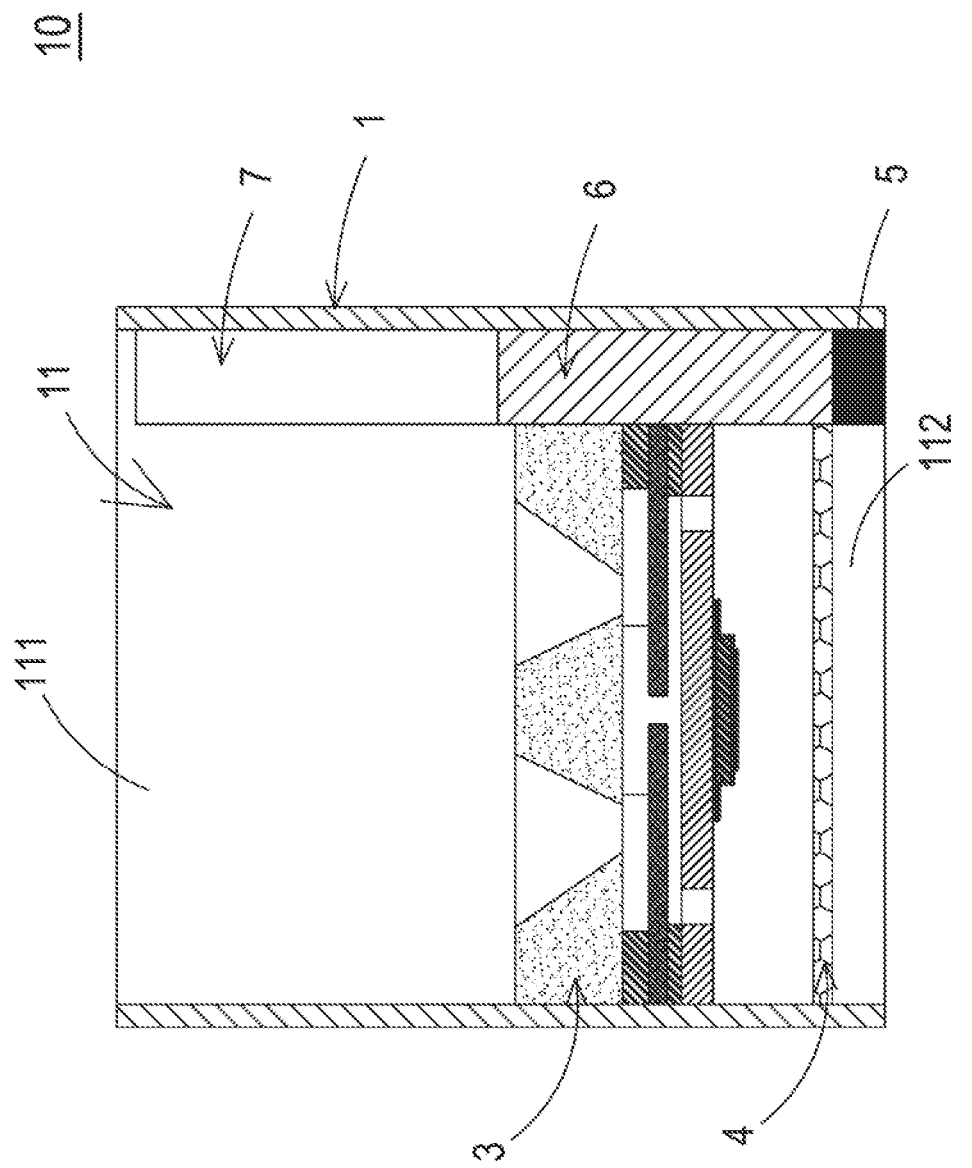
FIG. 2E illustrates a schematic cross-sectional view of a nasal-plug filter device having a second actuator to perform gas introduction, filtration, and purification according to an exemplary embodiment of the present disclosure.
Figure 2F:
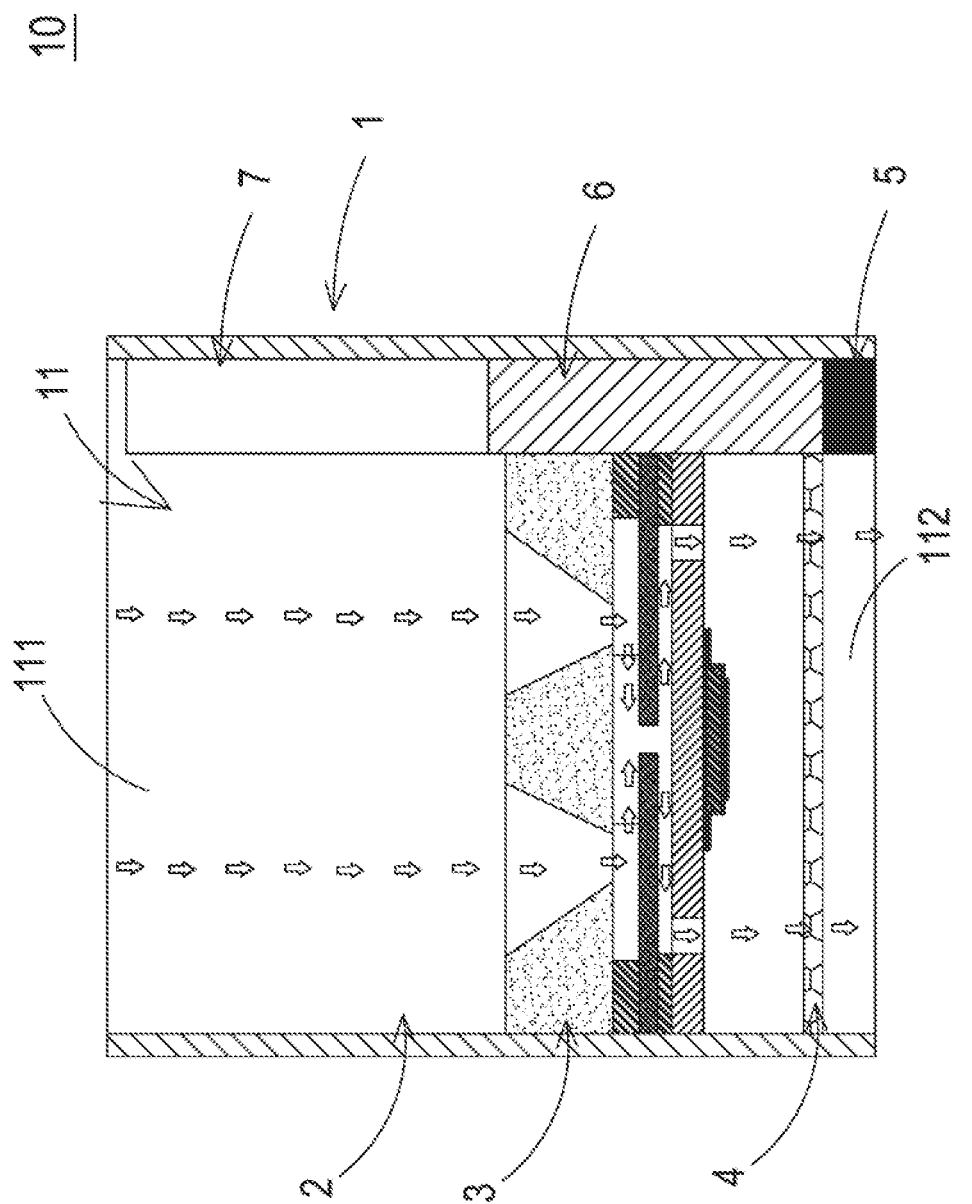
FIG. 2F illustrates a schematic cross-sectional view showing the gas flow direction in the nasal-plug filter device having the second actuator to perform gas introduction, filtration, and purification according to the exemplary embodiment of the present disclosure.
Figure 2G:
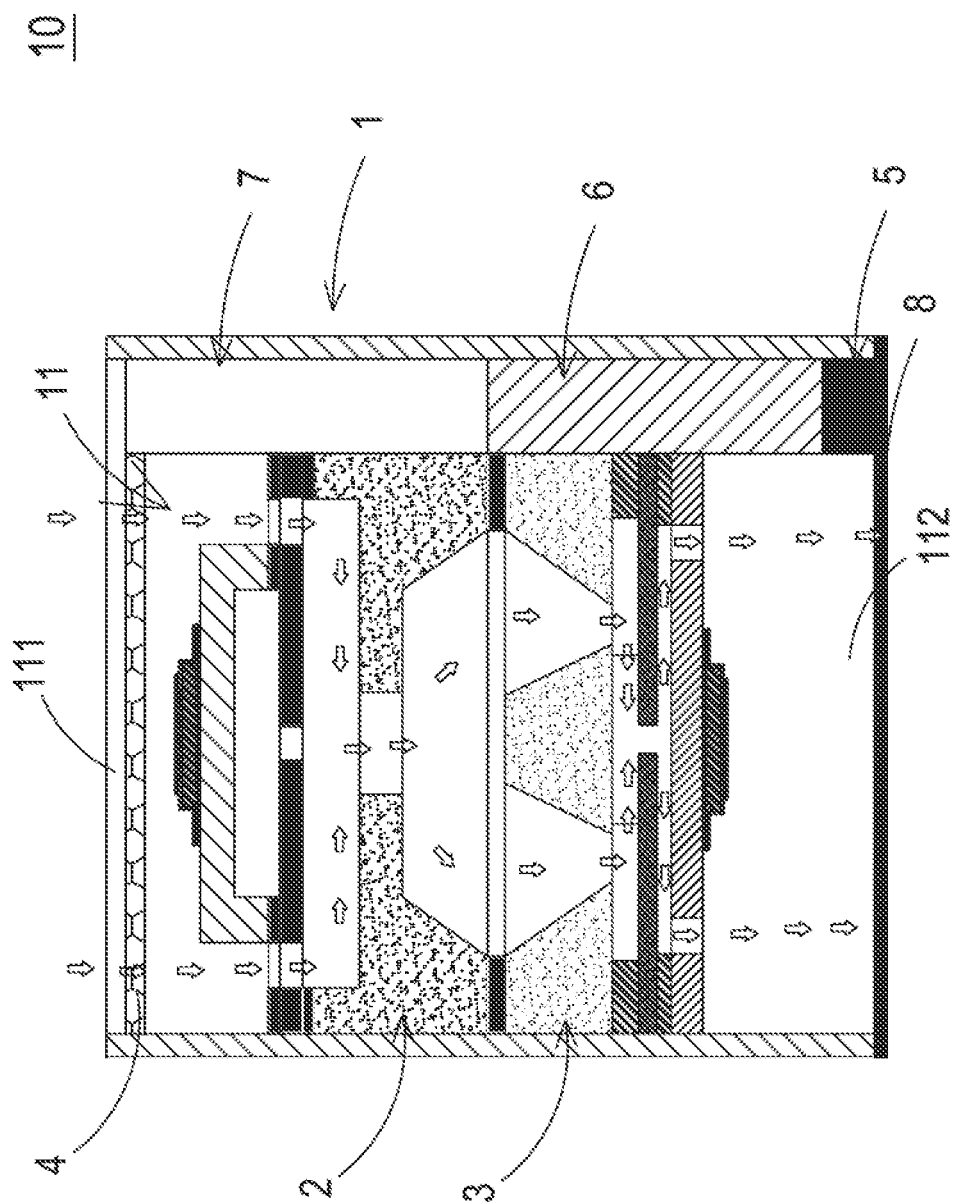
FIG. 2G illustrates a schematic cross-sectional view showing the gas flow direction in a nasal-plug filter device performing gas introduction, filtration, and purification according to another exemplary embodiment of the present disclosure.

In some other embodiments, as shown in FIG. 1 and FIG. 2G, the present disclosure provides another nasal-plug filter device 10. In this embodiment, the filter 4 is disposed at the inlet end 111 of the ventilating channel 11 for filtering gas introduced into the nasal-plug filter device 10. The first actuator 2, the second actuator 3, the driving chip 6, and the battery 7 are disposed at the inlet end 111 of the ventilating channel 11. The battery 7 provides operation power for the driving chip 6, so that the driving chip 6 can drive the first actuator 2 and the second actuator 3. The first actuator 2 fabricated by semiconductor manufacturing processes is driven to transmit the gas outside the device body 1 into the nasal-plug filter device 10 with a relatively higher pressure. The gas transmitted by the first actuator 2 will pass through the filter 4 for being filtered and purified first, and then be directed to the second actuator 3. The second actuator 3 fabricated by semiconductor manufacturing processes is stacked on and bonded to the first actuator 2, and is driven to further retransmit the gas transmitted by the first actuator 2 and purified by the filter 4 to the outlet end 112 for being discharged out. The gas sensor 5 is disposed at the outlet end 112 of the ventilating channel 11 for detecting the quality of the gas at the outlet end 112. The nasal-plug filter device 10 with such structure can be inserted into the nostril of a user.

In this embodiment, the first actuator 2 and the second actuator 3 may be combined, but not limited thereto, so as to improve the efficiency of gas introduction and the gas can pass through the filter 4 more quickly, so that a filtered and purified gas is provided. Moreover, the gas sensor 5 in the nasal-plug filter device 10 can also detect the introduced gas, so that the user not only can breathe filtered and purified gas, but also can understand the quality of the gas to be inhaled. Moreover, in this embodiment, a waterproof gas-permeable membrane 8 may be attached to the outlet end 112 of the device body 1, so that the gas transmitted into the device body 1 by the first actuator 2 and the second actuator 3 is not only filtered and purified by the filter 4, but is also driven through the waterproof gas-permeable membrane 8 before being inhaled by the user. Therefore, while the nasal-plug filter device 10 provides the user with the filtered and purified gas to breathe, the waterproof gas-permeable membrane 8 also prevents the liquid leaking from the nostril of the user from permeating into the device body 1 to affect the operation of the inner elements of the nasal-plug filter device.

Further, as shown in FIG. 2C and FIG. 2D, one embodiment of the present disclosure provides another nasal-plug filter device 10 including a device body 1, a first actuator 2, a filter 4, a gas sensor 5, a driving chip 6, and a battery 7. The device body 1 has a ventilating channel 11. The ventilating channel 11 has an inlet end 111 and an outlet end 112. The filter 4 is disposed at the outlet end 112 of the ventilating channel 11 for filtering the gas passing therethrough. The filtered gas is discharged out of the device body 1 from the outlet end 112. The first actuator 2, the driving chip 6, and the battery 7 are disposed at the inlet end 111 of the ventilating channel 11. The battery 7 provides operation power for the driving chip 6, so that the driving chip 6 can drive the first actuator 2. The first actuator 2 fabricated by semiconductor manufacturing processes is driven to transmit the gas outside the device body 1 into the nasal-plug filter device 10 with a relatively higher pressure. Then, the gas is further directed to the filter 4 for being filtered and purified. The gas sensor 5 is disposed at the outlet end 112 of the ventilating channel 11 for detecting the quality of the gas at the outlet end 112. The nasal-plug filter device 10 with such structure can be inserted into the nostril of a human. Since the gas introduction effect is enhanced by the first actuator 2 and thus a relatively larger amount of gas can be directed to the filter 4, the gas can pass through the filter 4 more quickly, so that a filtered and purified gas is provided for being inhaled by human. Moreover, the gas sensor 5 in the nasal-plug filter device 10 can also detect the introduced gas, so that the user not only can breathe the filtered and purified gas, but also can understand the quality of the gas to be inhaled.

Further, as shown in FIG. 2E and FIG. 2F, one embodiment of the present disclosure provides a nasal-plug filter device 10 including a device body 1, a second actuator 3, a filter 4, a gas sensor 5, a driving chip 6, and a battery 7. The device body 1 has a ventilating channel 11. The ventilating channel 11 has an inlet end 111 and an outlet end 112. The filter 4 is disposed at the outlet end 112 of the ventilating channel 11 for filtering the gas passing therethrough. The filtered gas is discharged out of the device body 1 from the outlet end 112. The second actuator 3, the driving chip 6, and the battery 7 are disposed at the inlet end 111 of the ventilating channel 11. The battery 7 provides operation power for the driving chip 6, so that the driving chip 6 can drive the second actuator 3. The second actuator 3 fabricated by semiconductor manufacturing processes is driven to transmit the gas outside the device body 1 into the nasal-plug filter device 10 with relatively high volume. Then, the gas is further directed to the filter 4 to be filtered and purified. The gas sensor 5 is disposed at the outlet end 112 of the ventilating channel 11 for detecting the quality of the gas at the outlet end 112. The nasal-plug filter device 10 having such structure can be inserted into a nostril of a human. Since the gas introduction effect is enhanced by the second actuator 3 and thus the second actuator 3 can direct a relatively larger amount of gas to the filter 4, so that the gas can pass through the filter 4 more quickly, and thus a filtered and purified gas is provided. Moreover, the gas sensor 5 in the nasal-plug filter device 10 can also detect the introduced gas, so that the user not only can breathe the filtered and purified gas, but also can understand the quality of the gas to be inhaled.

In some embodiments, the aforementioned driving chip 6 may further include a microprocessor (not shown) and a communication device (not shown). The microprocessor receives the gas detection data detected by the gas sensor 5 and performs a computation processing on the gas detection data for obtaining a gas quality data. The microprocessor then transmits the gas quality data to an external device through the communication device. The external device may receive the gas quality data and then send a warning notice and display records related to the warning notice. Through such configuration, the user can understand the quality of the gas to be inhaled. More specifically, the external device(s) (for example, mobile devices, computers, cloud devices) can receive the gas quality data and display records related to the gas quality data or may further store such records. Then, the external device(s) sends the warning notice as the gas quality data reaches a predetermined threshold value of the gas quality. The gas sensor 5 may be a volatile organic compound sensor for detecting the quality of the gas including such as formaldehyde, ammonia, carbon monoxide, carbon dioxide, oxygen, ozone gas, or other volatile organic compounds. Alternatively, the gas sensor 5 may be a virus sensor for obtaining a detection data of viruses.

As for the structure and the operation to guide gas in/out of the above-mentioned first actuator 2 and the second actuator 3 will be described as follows.

Figure 3A:
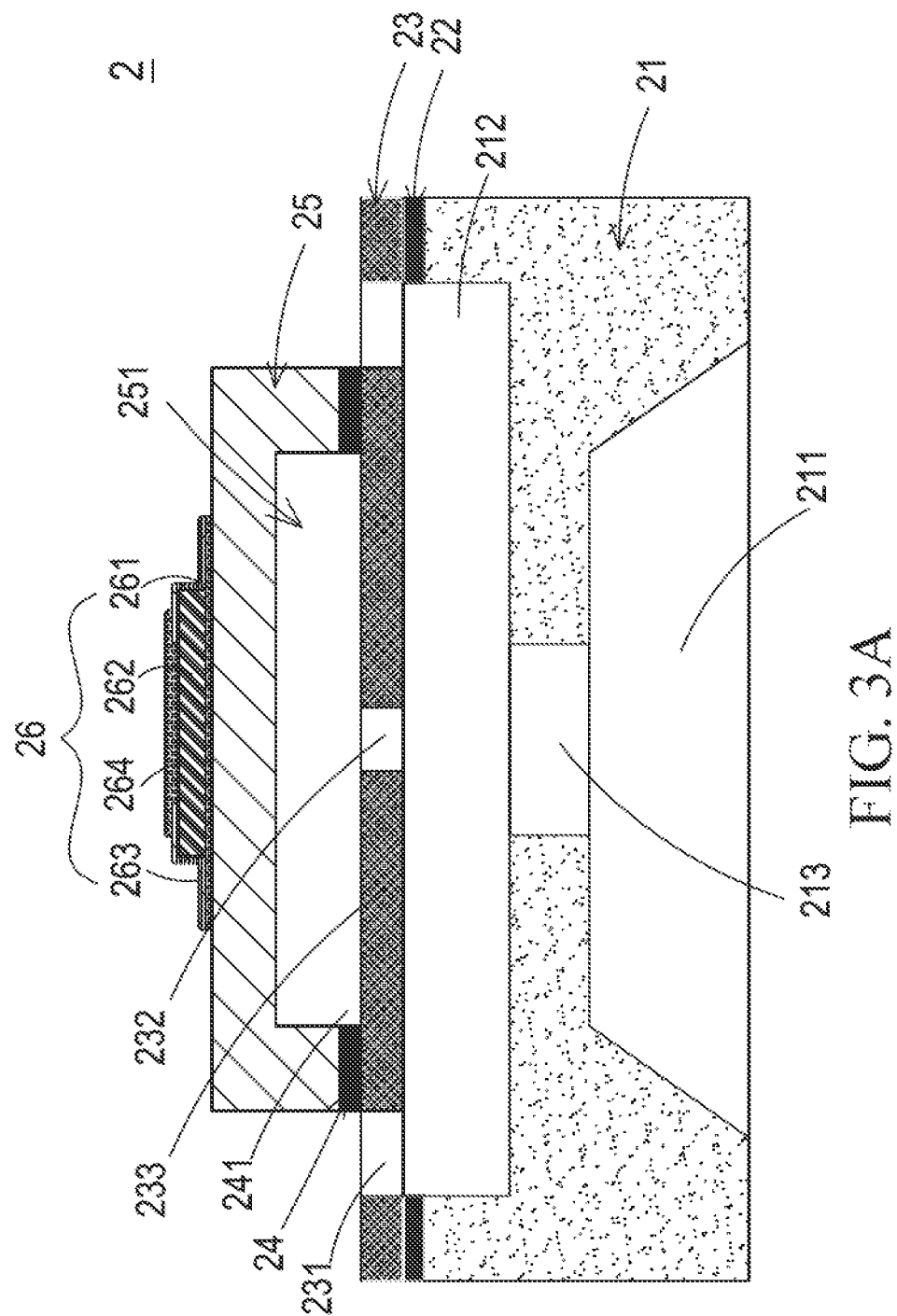
FIG. 3A illustrates a schematic cross-sectional view of the first actuator of the nasal-plug filter device according to an exemplary embodiment of the present disclosure.
Figure 3B:
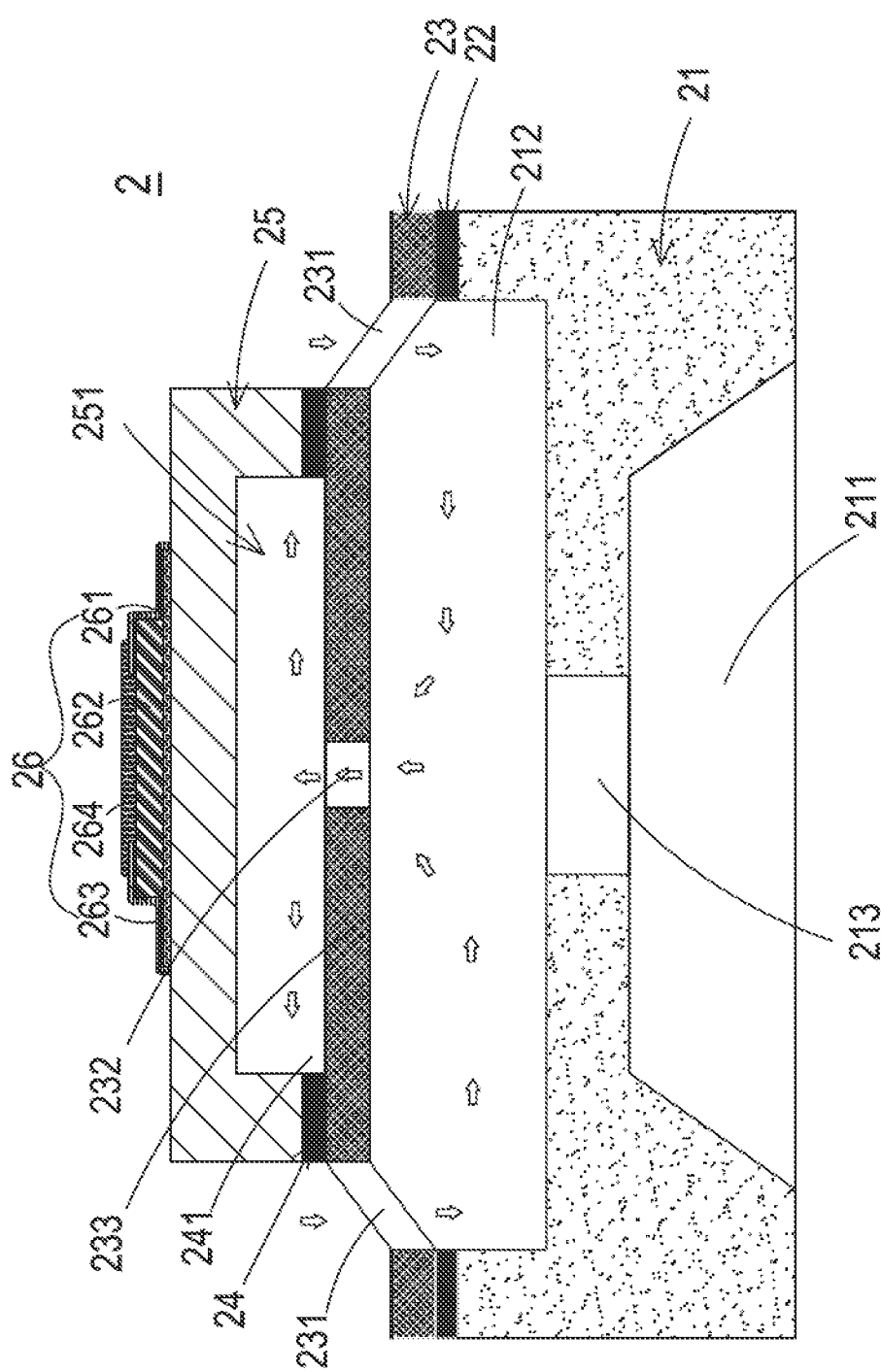
FIG. 3B and FIG. 3C illustrate schematic cross-sectional views showing the first actuator of the nasal-plug filter device at different operation steps.
Figure 3C:
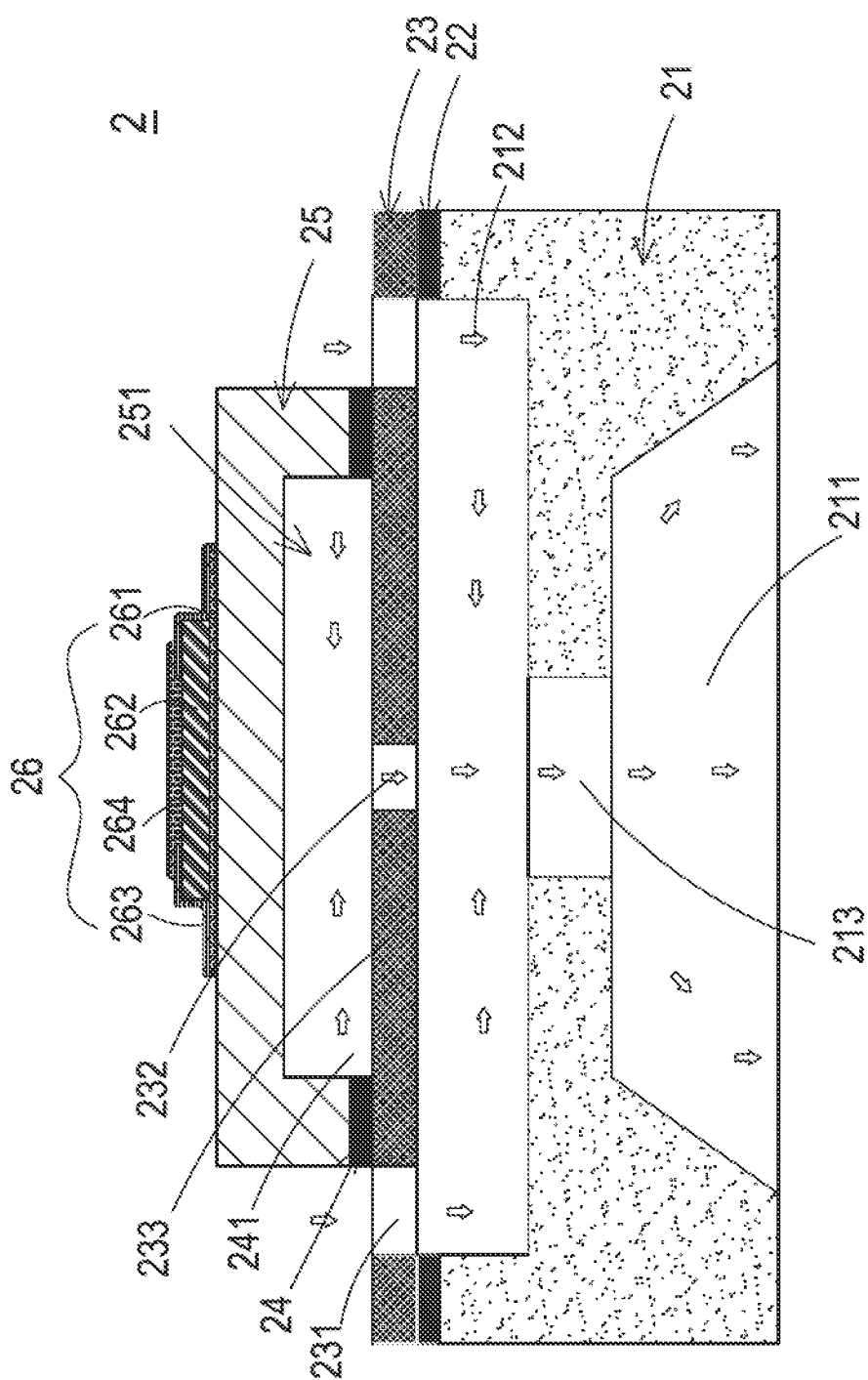

As shown in FIG. 3A to FIG. 3C, in some embodiments, the first actuator 2 includes an outlet base 21, a first oxide layer 22, a nozzle resonance layer 23, a second oxide layer 24, a resonance chamber layer 25, and a first piezoelectric component 26, which may be all fabricated by semiconductor manufacturing processes. The semiconductor manufacturing processes include an etching process and a deposition process. The etching process may be a wet etching process, a dry etching process, or a combination thereof, but not limited thereto. The deposition process may be a physical vapor deposition (PVD) process, a chemical vapor deposition (CVD) process, or a combination thereof, but not limited thereto. The detailed descriptions about the process are omitted.

In some embodiments, the aforementioned outlet base 21 is formed with an outlet chamber 211 and a compression chamber 212 through a silicon substrate etching process. A penetration hole 213 is formed by etching between the outlet chamber 211 and the compression chamber 212. The first oxide layer 22 is formed and stacked on the outlet base 21 by deposition. The portion of the first oxide layer 22 corresponding to the compression chamber 212 is removed by etching. The nozzle resonance layer 23 is formed and stacked on the first oxide layer 22 by deposition. A plurality of inlet holes 231 is formed at the portion of the nozzle resonance layer 23 corresponding to the compression chamber 212 by etching. A portion of the nozzle resonance layer 23 corresponding to the central portion of the compression chamber 212 is etched to form a nozzle hole 232, thereby forming a suspension area 233 capable of being vibrated between the inlet holes 231 and the nozzle hole 232. The second oxide layer 24 is formed and stacked on the suspension area 233 of the nozzle resonance layer 23 by deposition, and a portion of the second oxide layer 24 is etched to form a resonance chamber area 241 in communication with the nozzle hole 232. A resonance chamber 251 is formed on the resonance chamber layer 25 by a silicon substrate etching process, and the resonance chamber layer 25 is correspondingly stacked on and bonded to the second oxide layer 24, so that the resonance chamber 251 is corresponding to the resonance chamber area 241 of the second oxide layer 24. The first piezoelectric component 26 formed and stacked on the resonance chamber layer 25 by deposition includes a first lower electrode layer 261, a first piezoelectric layer 262, a first insulation layer 263, and a first upper electrode layer 264. The first lower electrode layer 261 is formed and stacked on the resonance chamber layer 25 by deposition, and the first piezoelectric layer 262 is formed and stacked on a portion of a surface of the first lower electrode layer 261 by deposition. The first insulation layer 263 is formed and stacked on a portion of a surface of the first piezoelectric layer 262 by deposition. The first upper electrode layer 264 is formed and stacked on the surface of the first insulation layer 263 and the remaining portion of the surface of the first piezoelectric layer 262 which is not covered by the first insulation layer 263 for being electrically connected to the first piezoelectric layer 262.

The structure of the first actuator 2 can be appreciated from above description. Next, the operation of gas introduction implemented by the first actuator 2 is elaborated below accompanied with FIGS. 3B and 3C. The first piezoelectric component 26 drives the nozzle resonance layer 23 to resonate with the first piezoelectric component 26, and thus the suspension area 233 of the nozzle resonance layer 23 will vibrate in a reciprocating manner. The gas outside the first actuator 2 can be drawn into the compression chamber 212 through the inlet holes 231, and further directed to the resonance chamber 251 through the nozzle hole 232. Through controlling the vibration frequency of the gas in the resonance chamber 251 and making the vibration frequency of the gas in the resonance chamber 251 nearly the same with the vibration frequency of the suspension area 233, the resonance chamber 251 and the suspension area 233 can generate the Helmholtz resonance effect. Then, the gas is discharged out from the resonance chamber 251 and converged at the compression chamber 212. The gas further passes through the penetration hole 213 and is discharged out from the outlet chamber 211 with a relatively higher pressure, thereby achieving high pressure transmission of gas and thus improving the transmission efficiency of the gas.

Figure 4A:
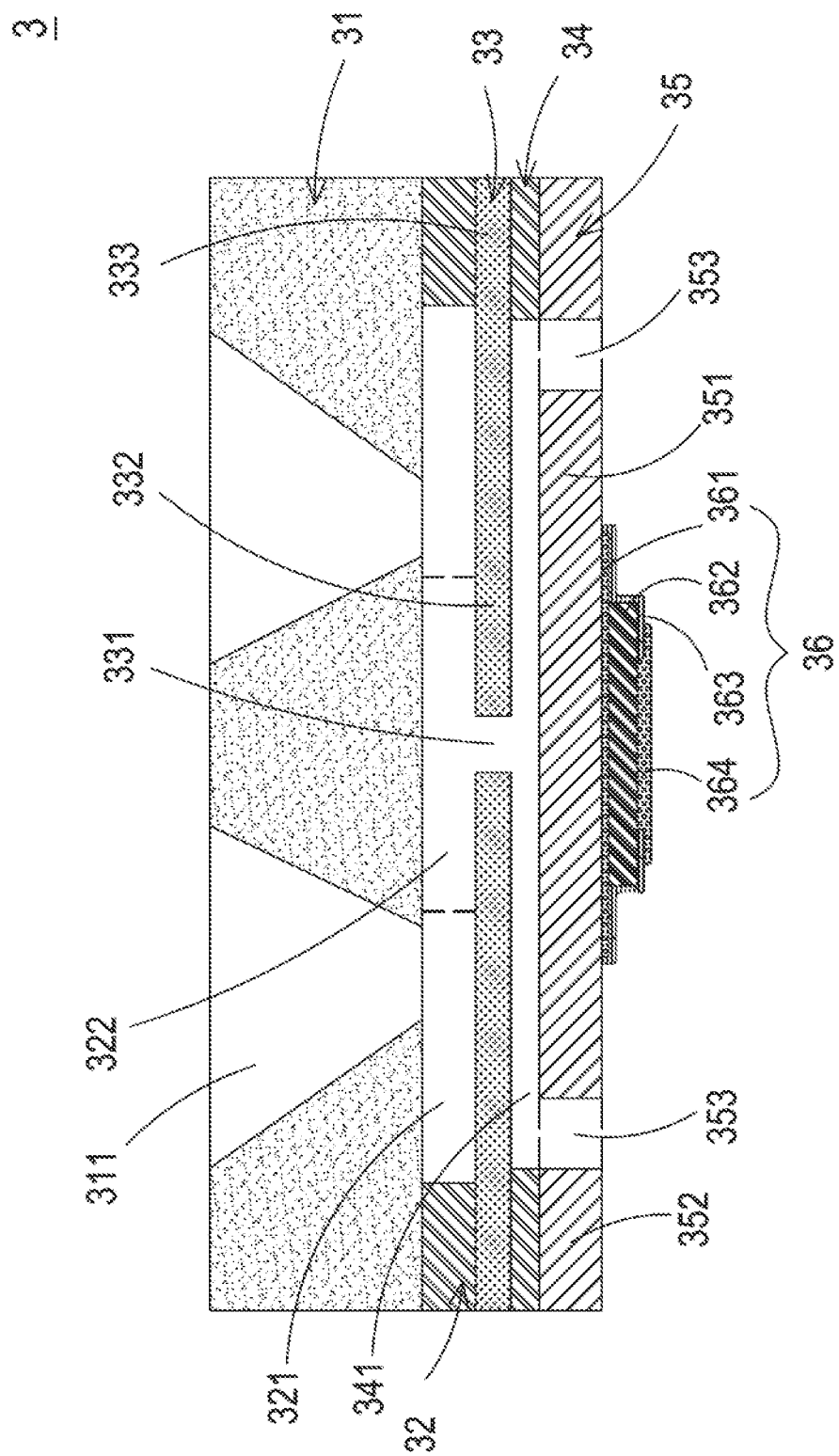
FIG. 4A illustrates a schematic cross-sectional view of the second actuator of the nasal-plug filter device according to an exemplary embodiment of the present disclosure.
Figure 4B:
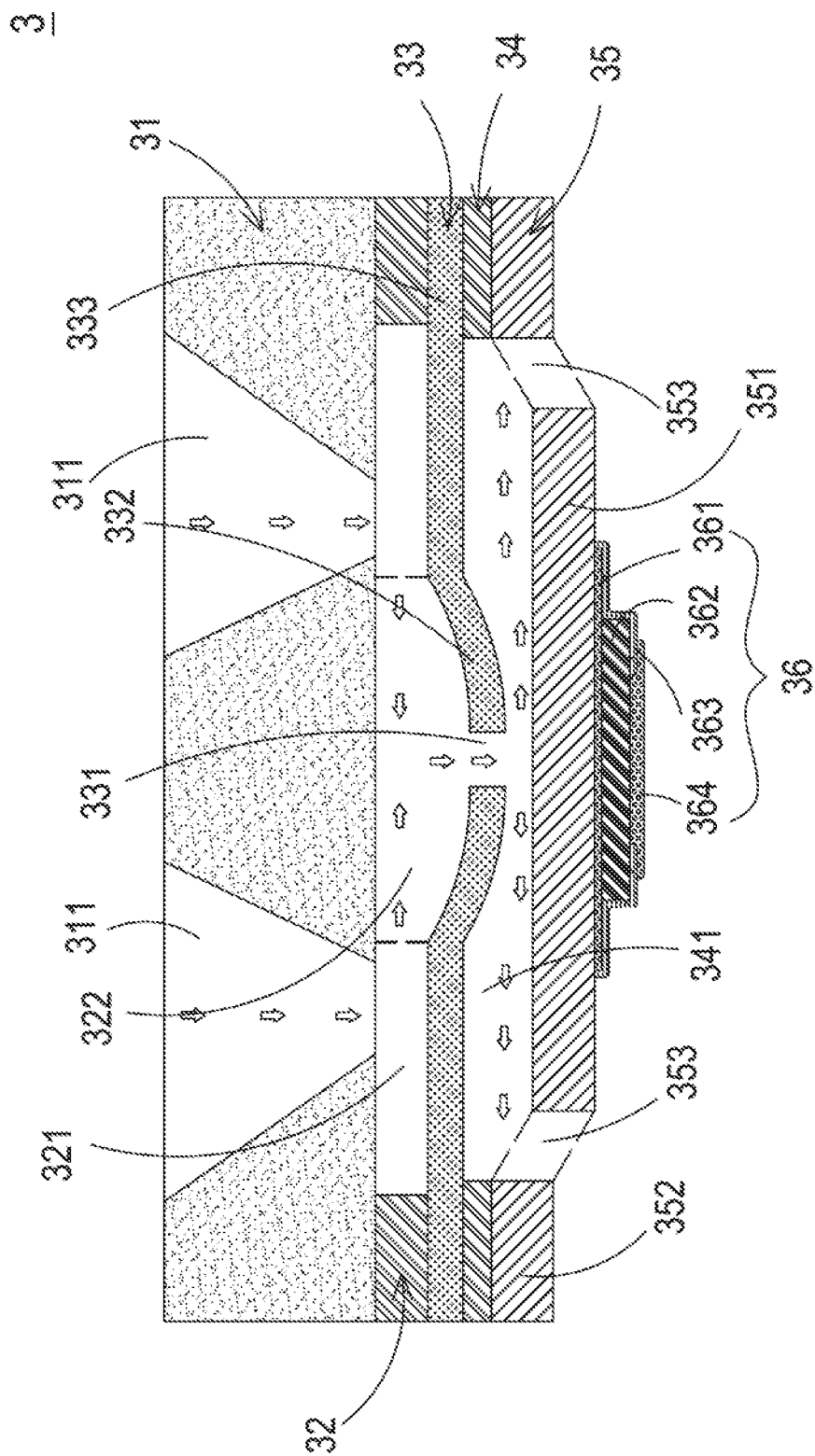
FIG. 4B and FIG. 4C illustrate schematic cross-sectional views showing the second actuator of the nasal-plug filter device at different operation steps.
Figure 4C:
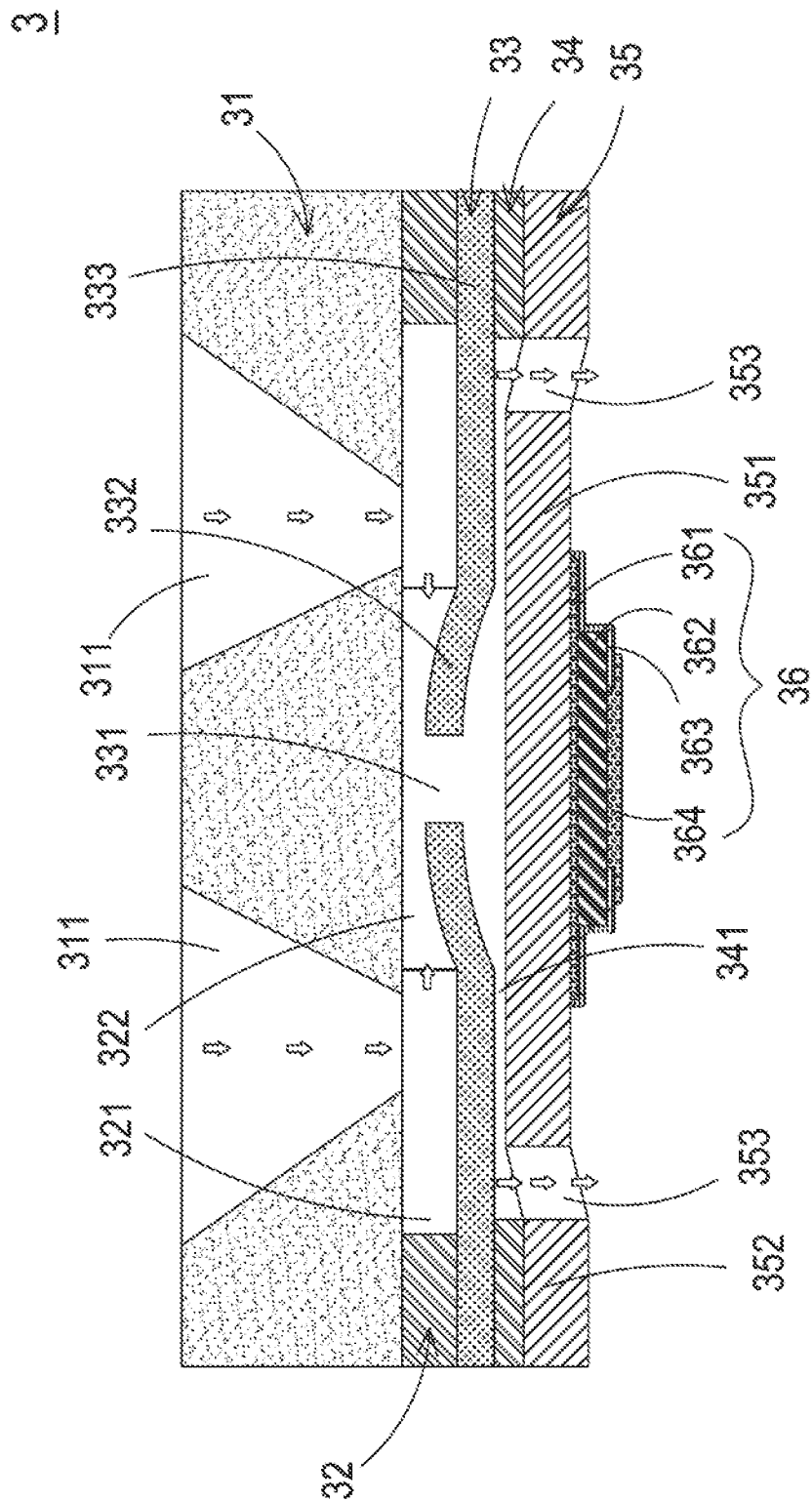

As shown in FIG. 4A to FIG. 4C, in some embodiments, the second actuator 3 includes an inlet base 31, a third oxide layer 32, a resonance layer 33, a fourth oxide layer 34, a vibration layer 35, and a second piezoelectric component 36, which may be all fabricated by semiconductor manufacturing processes. The semiconductor manufacturing processes include an etching process and a deposition process. The etching process may be a wet etching process, a dry etching process, or a combination thereof, but not limited thereto. The deposition process may be a physical vapor deposition (PVD) process, a chemical vapor deposition (CVD) process, or a combination thereof, but not limited thereto. The detailed descriptions about the process are omitted.

In some embodiments, the aforementioned inlet base 31 is formed with at least one inlet hole 311 by a silicon substrate etching process. The third oxide layer 32 is formed and stacked on the inlet base 31 by deposition, and the third oxide layer 32 is formed with a plurality of convergence channels 321 and a convergence chamber 322 by etching. The convergence channels 321 are in communication between the at least one inlet hole 311 of the inlet base 31 and the convergence chamber 322. The resonance layer 33 formed and stacked on the third oxide layer 32 through a silicon substrate deposition process is formed with a through hole 331, a vibration area 332, and a fixed area 333 by etching. The through hole 331 is formed at a center portion of the resonance layer 33. The vibration area 332 is formed on a periphery of the through hole 331. The fixed area 333 is formed on a periphery of the resonance layer 33. The fourth oxide layer 34 is formed and stacked on the resonance layer 33 by deposition, and the fourth oxide layer 34 is formed with a compression chamber area 341 by etching. The vibration layer 35 formed and stacked on the fourth oxide layer 34 by a silicon substrate deposition process is formed with an actuation area 351, an outer peripheral area 352, and a plurality of ventilation holes 353 by etching. The actuation area 351 is formed at a center portion of the vibration layer 35. The outer peripheral area 352 is formed around a periphery of the actuation area 351. The ventilation holes 353 are respectively formed between the actuation area 351 and the outer peripheral area 352. Accordingly, a compression chamber is formed by the vibration layer 35 and the compression chamber area 341 of the fourth oxide layer 34. The second piezoelectric component 36 formed and stacked on the actuation area 351 of the vibration layer 35 by deposition includes a second lower electrode layer 361, a second piezoelectric layer 362, a second insulation layer 363, and a second upper electrode layer 364. The second lower electrode layer 361 is formed and stacked on the actuation area 351 of the vibration layer 35 by deposition, and the second piezoelectric layer 362 is formed and stacked on a portion of a surface of the second lower electrode layer 361 by deposition. The second insulation layer 363 is formed and stacked on a portion of a surface of the second piezoelectric layer 362 by deposition. The second upper electrode layer 364 is formed and stacked on the surface of the second insulation layer 363 and the remaining portion of the surface of the second piezoelectric layer 362 which is not covered by the second insulation layer 363 for being electrically connected to the second piezoelectric layer 362.

The structure of the second actuator 3 can be appreciated from above description. Next, the operation of gas introduction implemented by the second actuator 3 is elaborated below accompanied with FIGS. 4B and 4C. The second piezoelectric component 36 drives the vibration layer 35 and the resonance layer 33 to resonate with the second piezoelectric component 36. Thus, the gas outside the second actuator 3 is drawn through the at least one inlet hole 311, passes through the convergence channels 321, and then is converged at the convergence chamber 322. Afterwards, the gas further passes through the through hole 331 of the resonance layer 33, and then be discharged out from the ventilation holes 353 of the vibration layer 35, thereby achieving high volume transmission of gas.

To sum up, the present disclosure provides different kinds of nasal-plug filter devices capable of being inserted in the nostril of a human. In one embodiment of the present disclosure provides a nasal-plug filter device with a first actuator or a second actuator. Through the first actuator or the second actuator inside the nasal-plug filter device, the introduction flow of the gas can be increased, so that the gas with higher pressure or higher volume can be directed to the filter, and thus the gas introduction effect can be improved. In another embodiment of the present disclosure provides a nasal-plug filter device with a first actuator and a second actuator in combination. The first actuator can provide gas with higher pressure for being introduced into the nostrils, and the second actuator can provide a relatively larger volume of the gas to the filter, whereby the gas introduction effect can be improved. These nasal-plug filter devices can drive the gas to pass through the filter more quickly, so that a filtered and purified gas is provided. Moreover, the gas sensor in the nasal-plug filter devices also can detect the introduced gas, so that the user not only can breathe the filtered and purified gas, but also can understand the quality of the gas to be inhaled.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A nasal-plug filter device, comprising:
   a device body having a ventilating channel, wherein the ventilating channel has an inlet end and an outlet end;
   a filter disposed at the outlet end;
   a first actuator disposed at the inlet end for being driven to transmit gas outside the device body into the device body with a relatively higher pressure;
   a second actuator stacked on and bonded to the first actuator for being driven to retransmit the gas transmitted by the first actuator to the filter to be filtered and purified; and
   a gas sensor disposed at the outlet end for detecting a gas quality of the gas at the outlet end.

2. The nasal-plug filter device according to claim 1, wherein the first actuator comprises:
   an outlet base formed with an outlet chamber and a compression chamber, wherein a penetration hole is formed by etching between the outlet chamber and the compression chamber;
   a first oxide layer formed and stacked on the outlet base, wherein a portion of the first oxide layer corresponding to the compression chamber is removed;
   a nozzle resonance layer formed and stacked on the first oxide layer, wherein a plurality of inlet holes is formed at a portion of the nozzle resonance layer corresponding to the compression chamber, and wherein a nozzle hole is formed on a portion of the nozzle resonance layer corresponding to a central portion of the compression chamber, thereby forming a suspension area capable of being vibrated between the plurality of inlet holes and the nozzle hole;
   a second oxide layer formed and stacked on the suspension area of the nozzle resonance layer, wherein a resonance chamber area in communication with the nozzle hole is formed on a portion of the second oxide layer;
   a resonance chamber layer, wherein a resonance chamber is formed on the resonance chamber layer, and wherein the resonance chamber layer is correspondingly stacked on and bonded to the second oxide layer, so that the resonance chamber corresponds to the resonance chamber area of the second oxide layer;
   a first piezoelectric component formed and stacked on the resonance chamber layer, wherein the first piezoelectric component comprises a first lower electrode layer, a first piezoelectric layer, a first insulation layer, and a first upper electrode layer, wherein the first lower electrode layer is formed and stacked on the resonance chamber layer, the first piezoelectric layer is formed and stacked on a portion of a surface of the first lower electrode layer, and the first insulation layer is formed and stacked on a portion of a surface of the first piezoelectric layer, and wherein the first upper electrode layer is formed and stacked on the surface of the first insulation layer and the remaining portion of the surface of the first piezoelectric layer which is not covered by the first insulation layer for being electrically connected to the first piezoelectric layer; and
   wherein the first piezoelectric component is capable of driving the nozzle resonance layer to resonate with the first piezoelectric component.

3. The nasal-plug filter device according to claim 1, wherein the second actuator comprises:
   an inlet base formed with at least one inlet hole;
   a third oxide layer formed and stacked on the inlet base, wherein the third oxide layer is formed with a plurality of convergence channels and a convergence chamber, and wherein the convergence channels are in communication between the at least one inlet holes of the inlet base and the convergence chamber;
   a resonance layer formed and stacked on the third oxide layer, wherein the resonance layer has a through hole, a vibration area, and a fixed area, wherein the through hole is formed at a center portion of the resonance layer, the vibration area is formed on a periphery of the through hole, and the fixed area is formed on a periphery of the resonance layer;
   a fourth oxide layer formed and stacked on the resonance layer, wherein the fourth oxide layer is formed with a compression chamber area;
   a vibration layer formed and stacked on the fourth oxide layer, wherein the vibration layer has an actuation area, an outer peripheral area, and a plurality of ventilation holes, wherein the actuation area is formed at a center portion of the vibration layer, the outer peripheral area is formed around a periphery of the actuation area, the ventilation holes are respectively formed between the actuation area and the outer peripheral area, and a compression chamber is defined between the vibration layer and the compression chamber area of the fourth oxide layer; and
   a second piezoelectric component formed and stacked on the actuation area of the vibration layer, wherein the second piezoelectric component has a second lower electrode layer, a second piezoelectric layer, a second insulation layer, and a second upper electrode layer, wherein the second lower electrode layer is formed and stacked on the actuation area of the vibration layer, the second piezoelectric layer is formed and stacked on a portion of a surface of the second lower electrode layer, the second insulation layer is formed and stacked on a portion of a surface of the second piezoelectric layer, and wherein the second upper electrode layer is formed and stacked on the surface of the second insulation layer and the remaining portion of the surface of the second piezoelectric layer which is not covered by the second insulation layer for being electrically connected to the second piezoelectric layer; and wherein the second piezoelectric component is capable of driving the vibration layer and the resonance layer to resonate with the second piezoelectric component.

4. The nasal-plug filter device according to claim 1, further comprising a driving chip and a battery both disposed at the inlet end, wherein the battery provides operation power for the driving chip, so that the driving chip is capable of driving the first actuator and the second actuator.

5. The nasal-plug filter device according to claim 4, wherein the driving chip further comprises a microprocessor and a communication device, wherein the microprocessor is capable of receiving the gas detection data detected by the gas sensor to perform a computation processing on the gas detection data for obtaining a gas quality data, the microprocessor is capable of transmitting the gas quality data to an external device through the communication device, and the external device is capable of receiving the gas quality data and sending a warning notice and display records related to the warning notice.

6. The nasal-plug filter device according to claim 5, wherein the gas sensor is a volatile organic compound sensor, so as to provide the gas detection data comprising a detection data of formaldehyde, ammonia, carbon monoxide, carbon dioxide, oxygen, or ozone gas.

7. The nasal-plug filter device according to claim 5, wherein the gas sensor is a virus sensor, so as to provide the gas detection data comprising a detection data of viruses.

8. The nasal-plug filter device according to claim 1, wherein the gas sensor is a particulate sensor for detecting particulate matters in PM1, PM2, or PM10.

9. The nasal-plug filter device according to claim 1, wherein the filter is a high-efficiency particulate air (HEPA) filter.

10. The nasal-plug filter device according to claim 1, wherein the filter is coated with a cleansing element containing chlorine dioxide for suppressing viruses and bacteria in the gas.

11. The nasal-plug filter device according to claim 1, wherein the filer is coated with a herbal protection coating layer comprising extracts of *Rhus chinensis* Mill and extracts of *Ginkgo biloba* to form a herbal protection anti-allergy filter which can efficiently perform anti-allergy function and destroy cell surface proteins of influenza viruses passing through the herbal protection anti-allergy filter.

12. The nasal-plug filter device according to claim 1, further comprising a waterproof gas-permeable membrane attached to the outlet end.

13. A nasal-plug filter device set, comprising:
two nasal-plug filter devices according to claim 1; and
a connection element connected between the two nasal-plug filter devices, wherein the two nasal-plug filter devices is capable of being inserted into two nostrils of a user respectively so as to provide filtered and purified gas for the user.

14. A nasal-plug filter device, comprising:
a device body having a ventilating channel, and wherein the ventilating channel has an inlet end and an outlet end;
a filter disposed in the ventilating channel;
a first actuator disposed at the ventilating channel for being driven to transmit gas outside the device body into the device body with a relatively higher pressure and to the filter to be filtered and purified; and
a gas sensor disposed at the outlet end for detecting a gas quality of the gas at the outlet end.

15. The nasal-plug filter device according to claim 14, wherein the first actuator comprises:
an outlet base formed with an outlet chamber and a compression chamber, wherein a penetration hole is formed between the outlet chamber and the compression chamber;
a first oxide layer formed and stacked on the outlet base, wherein a portion of the first oxide layer corresponding to the compression chamber is removed;
a nozzle resonance layer formed and stacked on the first oxide layer, wherein a plurality of inlet holes is formed at a portion of the nozzle resonance layer corresponding to the compression chamber, and wherein a nozzle hole is formed on a portion of the nozzle resonance layer corresponding to a central portion of the compression chamber, thereby forming a suspension area capable of being vibrated between the plurality of inlet holes and the nozzle hole;
a second oxide layer formed and stacked on the suspension area of the nozzle resonance layer, wherein a resonance chamber area in communication with the nozzle hole is formed on a portion of the second oxide layer;
a resonance chamber layer, wherein a resonance chamber is formed on the resonance chamber layer, and wherein the resonance chamber layer is correspondingly stacked on and bonded to the second oxide layer, so that the resonance chamber is corresponding to the resonance chamber area of the second oxide layer;
a first piezoelectric component formed and stacked on the resonance chamber layer, wherein the first piezoelectric component comprises a first lower electrode layer, a first piezoelectric layer, a first insulation layer, and a first upper electrode layer, wherein the first lower electrode layer is formed and stacked on the resonance chamber layer, the first piezoelectric layer is formed and stacked on a portion of a surface of the first lower electrode layer, and the first insulation layer is formed and stacked on a portion of a surface of the first piezoelectric layer, and wherein the first upper electrode layer is formed and stacked on the surface of the first insulation layer and the remaining portion of the surface of the first piezoelectric layer which is not covered by the first insulation layer for being electrically connected to the first piezoelectric layer; and
wherein the first piezoelectric component is capable of driving the nozzle resonance layer to resonate with the first piezoelectric component.

16. A nasal-plug filter device, comprising:
a device body having a ventilating channel, wherein the ventilating channel has an inlet end and an outlet end;
a filter disposed in the ventilating channel;
a second actuator disposed at the ventilating channel for being driven to transmit gas outside the device body into the device body with a relatively higher volume and to the filter to be filtered and purified; and
a gas sensor disposed at the outlet end for detecting a gas quality of the gas at the outlet end.

17. The nasal-plug filter device according to claim 16, wherein the second actuator comprises:
an inlet base formed with at least one inlet hole;

a third oxide layer formed and stacked on the inlet base, wherein the third oxide layer is formed with a plurality of convergence channels and a convergence chamber, and wherein the convergence channels are in communication between the at least one inlet holes of the inlet base and the convergence chamber;

a resonance layer formed and stacked on the third oxide layer, wherein the resonance layer has a through hole, a vibration area, and a fixed area, wherein the through hole is formed at a center portion of the resonance layer, the vibration area is formed on a periphery of the through hole, and the fixed area is formed on a periphery of the resonance layer;

a fourth oxide layer formed and stacked on the resonance layer, wherein the fourth oxide layer is formed with a compression chamber area;

a vibration layer formed and stacked on the fourth oxide layer, wherein the vibration layer has an actuation area, an outer peripheral area, and a plurality of ventilation holes, wherein the actuation area is formed at a center portion of the vibration layer, the outer peripheral area is formed around a periphery of the actuation area, the ventilation holes are respectively formed between the actuation area and the outer peripheral area, and a compression chamber is defined between the vibration layer and the compression chamber area of the fourth oxide layer; and a second piezoelectric component formed and stacked on the actuation area of the vibration layer, wherein the second piezoelectric component has a second lower electrode layer, a second piezoelectric layer, a second insulation layer, and a second upper electrode layer, wherein the second lower electrode layer is formed and stacked on the actuation area of the vibration layer, the second piezoelectric layer is formed and stacked on a portion of a surface of the second lower electrode layer, the second insulation layer is formed and stacked on a portion of a surface of the second piezoelectric layer, and wherein the second upper electrode layer is formed and stacked on the surface of the second insulation layer and the remaining portion of the surface of the second piezoelectric layer which is not covered by the second insulation layer for being electrically connected to the second piezoelectric layer; and wherein the second piezoelectric component is capable of driving the vibration layer and the resonance layer to resonate with the second piezoelectric component.

* * * * *